United States Patent [19]

Causse et al.

[11] Patent Number: 4,978,880

[45] Date of Patent: Dec. 18, 1990

[54] PIEZOELECTRIC CAPSULE WITH FLAT SUPPORTING SURFACE AND RESILIENT HOLDING MEANS

[75] Inventors: Pierre Causse, Dole; Peter Graham, Bonneville; Bernard Maury, Bonneville; Jean-Claude Walter, Bonneville, all of France

[73] Assignee: Horlogerie Photographique Francaise Societe Anonyme, Bonneville, France

[21] Appl. No.: 484,383

[22] Filed: Feb. 23, 1990

[30] Foreign Application Priority Data

Feb. 27, 1989 [FR] France ................................ 89 02931

[51] Int. Cl.[5] .............................................. H01L 41/08

[52] U.S. Cl. ...................................... 310/324; 381/190

[58] Field of Search ........................ 310/324, 355, 356; 381/190

[56] References Cited

U.S. PATENT DOCUMENTS 4,230,383 10/1980 Burnstein et al. .............. 310/324 X
4,295,009 10/1981 Weidler ................................ 179/110
4,420,706 12/1983 Siebold et al. ...................... 310/324
4,429,247 1/1984 Feldman ......................... 310/324 X

FOREIGN PATENT DOCUMENTS 2126556 12/1971 Fed. Rep. of Germany .
2128399 4/1989 United Kingdom .

OTHER PUBLICATIONS

Sounder Unit, by Baumhauer, Jr. et al., Western Electric Tech. Digest, No. 59, Jul. 1980, p. 1.
Patent Abstracts of Japan, vol. 10, No. 46, (E-383), [2103], Feb. 22, 1986.
Patent Abstracts of Japan, vol. 10, No. 184, (E-415) [2240], Jun. 27, 1986.

*Primary Examiner*—Mark O. Budd
*Attorney, Agent, or Firm*—Ratner & Prestia

[57] ABSTRACT

A piezoelectric capsule with flat supporting surface and resilient holding means is disclosed, comprising a hollow metal lid (8) fitted on a base body (7) formed of a printed circuit, and a piezoelectric membrane (1) applied against a front step (17) of the lid (8). The resilient holding means (22), fixed to the base body (7), bear on the central zone of the rear face (5) of the membrane (1). The resilient means (22) hodl the membrane (1) mechanically in position and simultaneously provide peripheral sealing by the fact that the corresponding surfaces of the front step (17) and of the membrane (1) are perfectly flat.

15 Claims, 4 Drawing Sheets

PIEZOELECTRIC CAPSULE WITH FLAT SUPPORTING SURFACE AND RESILIENT HOLDING MEANS

BACKGROUND OF THE INVENTION

1. Field of the Invention

The present invention relates to piezoelectric transducers whose vibrating element is formed of a piezoelectric material layer membrane having electrodes and being held at its periphery in a capsule case.

2. Description of the Prior Art

This type of capsule has been known for many years and is described for example in the documents GB-A-2 046 554, JP-A-58 202699 or JP-A-60 199298.

In these known capsules, the membrane is formed of a thin disk to which is fixed a piezoelectric ceramic layer covering the central zone of the disk, the two faces of the piezoelectric ceramic layer being metallized so as to form respectively an internal electrode applied against the thin disk and an external electrode. The membrane is housed in a case formed of a base body and a lid fitting one on the other along a closed generally circular periphery. The base body forms a first wall substantially parallel to the disk and defining with the disk a rear acoustic cavity. The lid forms a second wall substantially parallel to the disk and defining with the disk a front acoustic cavity. The case comprises a supporting surface, for example in the form of an inner peripheral step, against which the periphery of the disk is held applied by holding means. Electric connection means provide the respective electric connections of one and other of the electrodes, with a first and second external connection terminal of the case.

In known capsules, the membrane is held mechanically in position with respect to the case by a rigid or resilient element bearing along the periphery of the membrane disk.

Thus, in the document GB-A-2 046 554, the periphery of the disk bears on a peripheral supporting surface of the base body, against which it is held by a peripheral O-seal inserted between the lid and the disk. In the documents JP-A-58 202699 or JP-A-60 199298, the disk is also held against a peripheral supporting surface of the case, against which it is urged by a peripheral O-seal inserted between the disk and the case.

The inventors have discovered that the presence of such O-seals in a capsule has drawbacks during large-scale production; in fact, known seals usable for large scale production are generally of dimensions which are not very regular, which induces defects in the evenness of the surfaces holding the piezoelectric membrane and variations in the acoustic qualities of the capsules thus obtained. The defects related to the presence of O-seals also result from the variation of thickness of the other stacked parts forming the capsule, particularly the base body and the lid, creating a nipping force on the periphery of the disk which is difficult to control. The mechanical holding means of the invention avoid such variations, and hold the membrane in position without using an O-seal.

According to another object of the invention, the new capsule structure substantially increases the possibilities of deformation of the peripheral zone of the disk, so that the electroacoustic qualities of the capsule are substantially increased.

When seeking to do without the presence of an O-seal or peripheral fitting of the membrane, the difficulty arises from the fact that the seal or fitting, in known capsules, not only hold the membrane against the step of the case but further provide sealing between the front acoustic cavity disposed in front of the membrane and the rear acoustic cavity disposed at the rear of the membrane. For that, the particular means of the invention, for holding the membrane mechanically in the case, provide at the same time sufficient sealing between the front acoustic cavity and the rear acoustic cavity.

Such sealing is further obtained, according to the invention, in a structure which substantially increases the possibilities of deformation of the peripheral zone of the disk. A priori, the two functions lead to contrary requirements, which the invention reconciles.

The invention further provides particular embodiments leading to the general improvement of the electroacoustic qualities of the capsule. In particular, attempts have been made to distribute the natural mechanical vibratory frequencies of the different elements of the capsule, so as to obtain the flattest possible response curve in the usual operating frequency range.

Another effect sought is to obtain a good compromise between the acoustic effect of the capsule and its size, particularly its thickness.

SUMMARY OF THE INVENTION

To attain these objects, as well as others, the capsule of the invention comprises the main elements of known capsules, namely a membrane formed of a thin disk carrying a piezoelectric ceramic layer covering the central zone of the disk, a case formed of a base body and a lid, a peripheral step of the case against which the periphery of the disk is held applied by resilient holding means, a first and second electric connection terminals connected to the electrodes of the piezoelectric membrane by first and second electric connection means; according to the invention:

- the thin disk comprises a peripheral portion front: face with a substantially flat shape, forming a zone of contact with the front peripheral step,
- the resilient holding means bear on the intermediate zone of the rear membrane face.

The precise circular supporting surface defining a continuous flat surface of contact with the disk has a surface quality such that the inherent flatness is provided with a tolerance less than or equal to 0.03 mm.

Such precision may be obtained by the usual methods of machining a blank, e.g. by turning. The usual stamping methods, currently used for the production of aluminium elements, do not allow sufficient accuracy to be obtained for large scale production.

In accordance with the invention, the lid may advantageously be formed by a flow-turning method, which consists in disposing a blank in a mandrel having the desired external shape of the lid, and in causing the material to flow by the penetration into the blank of a die having the internal shape of the lid to be obtained. Such a method has proved to be quite appropriate for obtaining the desired accuracy of surface quality.

According to the invention, the step of the case, formed in the lid, has advantageously, in radial cross section, a trapezium shaped profile whose small base forms the precise circular supporting surface for the membrane, said circular supporting surface being separated from the side wall of the lid by a peripheral groove allowing free oscillation of the edge of the disk forming the membrane.

The inventors have discovered that it is particularly advantageous, particularly for obtaining the widest and flattest possible frequency response curve of the capsule, to have the resilient holding means bearing on the membrane in the zone situated in the vicinity of the nodal circle of the membrane, namely the zone formed by the loci of the nodes formed by the third circular vibration mode of the membrane, said resilient holding means bearing on said membrane at at least two points distant from each other.

In a first embodiment, the resilient holding means may comprise several resilient holding elements separate from each other, each one bearing both on the rear face of the membrane and on the base body of the case.

In another embodiment, said resilient holding means may be assembled together in a single element with several arms, comprising a single zone bearing on the base body, the ends of the arms bearing on the rear face of the membrane.

Preferably, to each bearing point of the resilient holding means on the external electrode, there corresponds a resilient connection with different mechanical characteristics, thus presenting different natural vibratory modes.

A good compromise between the acoustic efficiency of the capsule and its size is obtained, according to the invention, by combining a membrane whose natural frequency is about 1 kHz with an acoustic filter comprising a front acoustic cavity and a rear acoustic cavity whose respective heights are about 1 mm, for a diameter of about 30 mm. The hights are about 1 mm allow the membrane to oscillate freely and permit housing of the connection means.

BRIEF DESCRIPTION OF THE DRAWINGS

Other objects, features and advantages of the present invention will be clear from the following description of a particular embodiment, with reference to the accompanying figures, in which.

DESCRIPTION OF THE PREFERRED EMBODIMENTS

Figure 1:
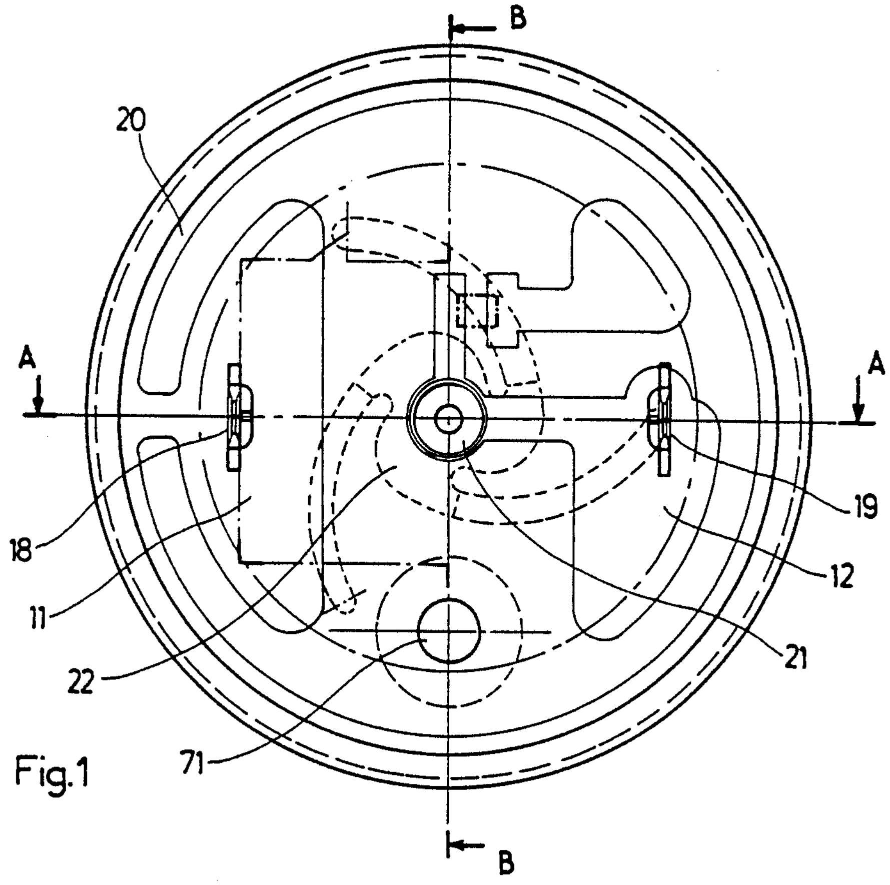
FIG. 1 shows a top view of the external surface of the capsule base body according to the invention.

As shown in the figures, a piezoelectric capsule according to the invention comprises a membrane 1 formed of a thin disk 2 with circular contour, to which is fixed a piezoelectric ceramic layer 3 covering the central zone of disk 2. In the embodiment shown, disk 2 is made from an electrically conducting material, for example brass, and the piezoelectric ceramic layer 3 has a circular contour which is concentric with respect to disk 2, covering the central zone of the disk and leaving apparent a peripheral border on the face of disk 2, to which it is applied. The piezoelectric ceramic layer is metallized on both faces, its internal face 4 forming an internal electrode and being applied against disk 2, while its external face 5 forms an external electrode and is apparent.

Membrane 1 is housed in a case 6 formed of a base body 7 and a hollow lid 8, fixed together along a closed periphery 9, e.g. circular such as shown. The base body 7, in the embodiment shown, is formed of a flat plate of insulating material, for example a material generally used in the printed circuit technique, whose external face 10 carries conducting tracks 11 and 12 shown in FIG. 1. Lid 8 is made from an electrically conducting material, for example aluminium or an aluminium alloy, and comprises a central circular wall 13 joined to a peripheral side wall 14. The peripheral wall 14 comprises a rear step 15, narrowing the internal space of case 6 as shown in figures 3 or 2, against which the periphery of the base body 7 bears. The edge 16 of the peripheral wall 14 is bent inwards so as to bear against the external face 10 of base body 7, and crimp said base body 7 to the lid 8.

The peripheral wall 14 of lid 8 further comprises a front step 17, forming a second narrowing of the inner space of case 6 as shown in FIGS. 2 and 3, and disposed about half way between the central wall 13 and the rear step 15. Membrane 1 is held applied against the front step 17 of lid 8 by resilient means which will be described hereafter.

Figure 2:
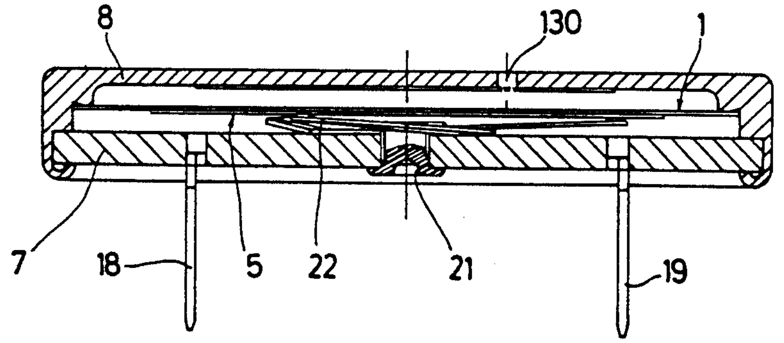
FIG. 2 is a front view of a capsule according to the invention in cross section through the plane A—A of FIG. 1.
Figure 3:
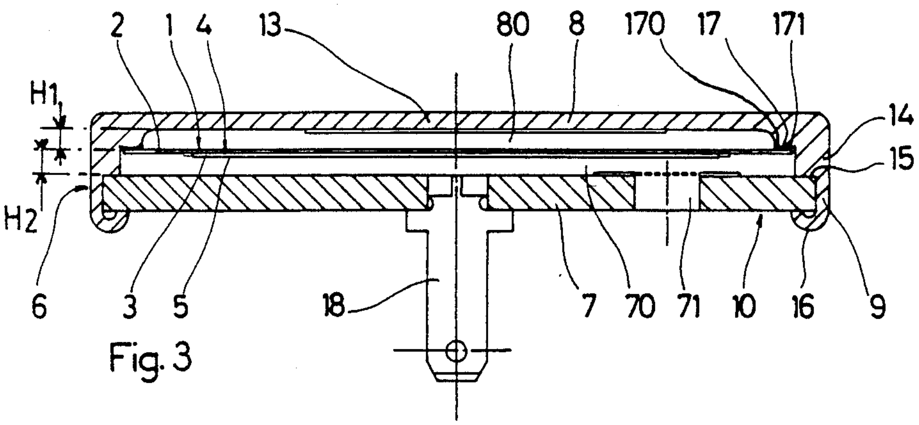
FIG. 3 is a side view of the capsule according to the invention in cross section through the plane B—B of FIG. 1.
Figure 4:
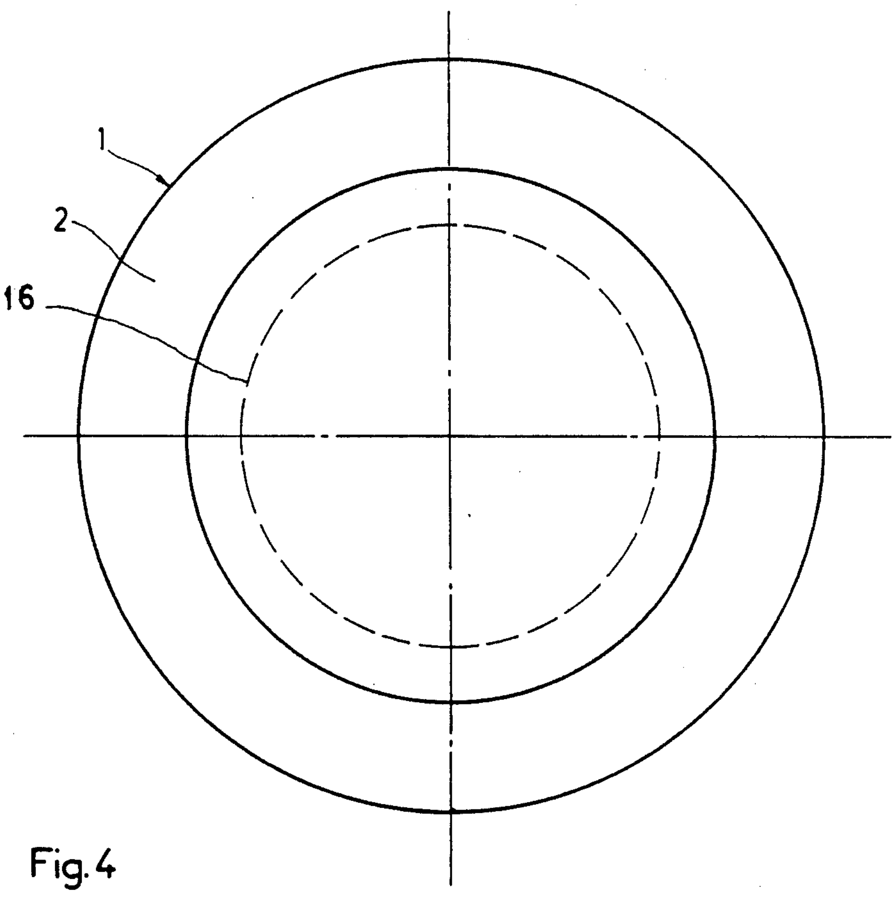
FIG. 4 is a bottom view of a capsule membrane according to the invention.
Figure 5:
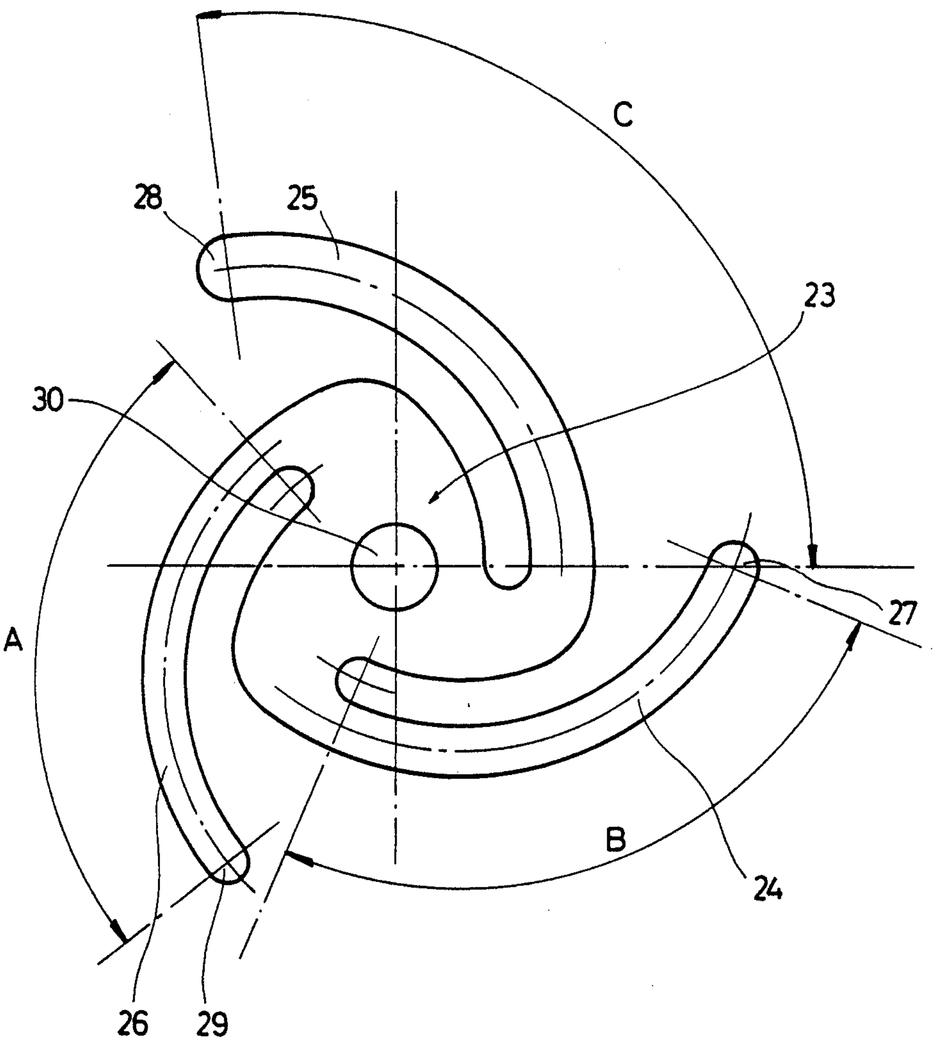
FIG. 5 is a top view of a particular embodiment of the resilient holding means according to the invention.

When the capsule is assembled, as shown in FIGS. 1 to 3, the base body 7 forms a first wall substantially parallel to disk 2, with which it forms a rear acoustic cavity 70, and the central wall 13 of lid 8 is substantially parallel to disk 2 and forms therewith a front acoustic cavity 80.

In a way known per se, the central wall 13 of lid 8 comprises holes 130 for sound to pass from the front acoustic cavity 80 to the external atmosphere, and the base body 7 comprises a passage 71 with an acoustic filter connecting the rear acoustic cavity 70 with the external atmosphere.

According to the invention, the respective heights H1 and H2 of the front acoustic cavity 80 and the rear acoustic cavity 70 are advantageously equal to about 1 mm, for example between 0.9 and 1.1 mm.

A first electric connection terminal 18 is fitted to the base body 7 and projects from the external face 10 of said base body 7 for electric connection to an external circuit. Similarly, a second electric connection terminal 9 is fitted to base body 7 and projects from the external face 10 of said base body 7 for connection to an external electric circuit. The first electric connection terminal 18 is soldered to the first conducting track 11 of base body 7, said conducting track 11 comprising a peripheral portion 20 in contact with lid 8. Thus, the first electric connection terminal 18 is connected electrically to the internal electrode 4 by the conducting disk 2, the conducting lid 8 and the conducting track 11.

The second electric connection terminal 19 is connected electrically to the external electrode 5 of the membrane. This connection may for example be provided by traditional means such as those described in the prior patents, for example, an electric conductor in the form of a wire soldered both to the connection terminal and to the external electrode 5.

A resilient holding means 22 holds membrane 1 against the front step 17 of lid 8, while freeing the periphery of the membrane. For that, the resilient holding means 22, bearing against or fixed to the center of base body 7, for example fixed by rivet 21, has a natural resilience and shape such that, when the capsule is assembled as shown in the figures, with membrane inserted between lid 8 and base body 7, and with the resilient holding means 22 inserted between said membrane 1 and base body 7, the resilient holding means bear against the intermediate zone of the rear face of the membrane and urge membrane 1 resiliently in the direction of lid 8 to apply its periphery against the front step 17.

The resultant bearing force exerted by the resilient means 22 on membrane 1 is advantageously between 0.3 Newton and 0.5 Newton, for a membrane whose diameter is equal to about 30 mm.

In the embodiment shown, the front step 17 has, in radial cross section, a trapezium shaped profile whose small base 170 forms a circular ring and provides a bearing surface for disk 2, said small base being separated from the peripheral wall 14 by a peripheral groove 171.

Figure 6:
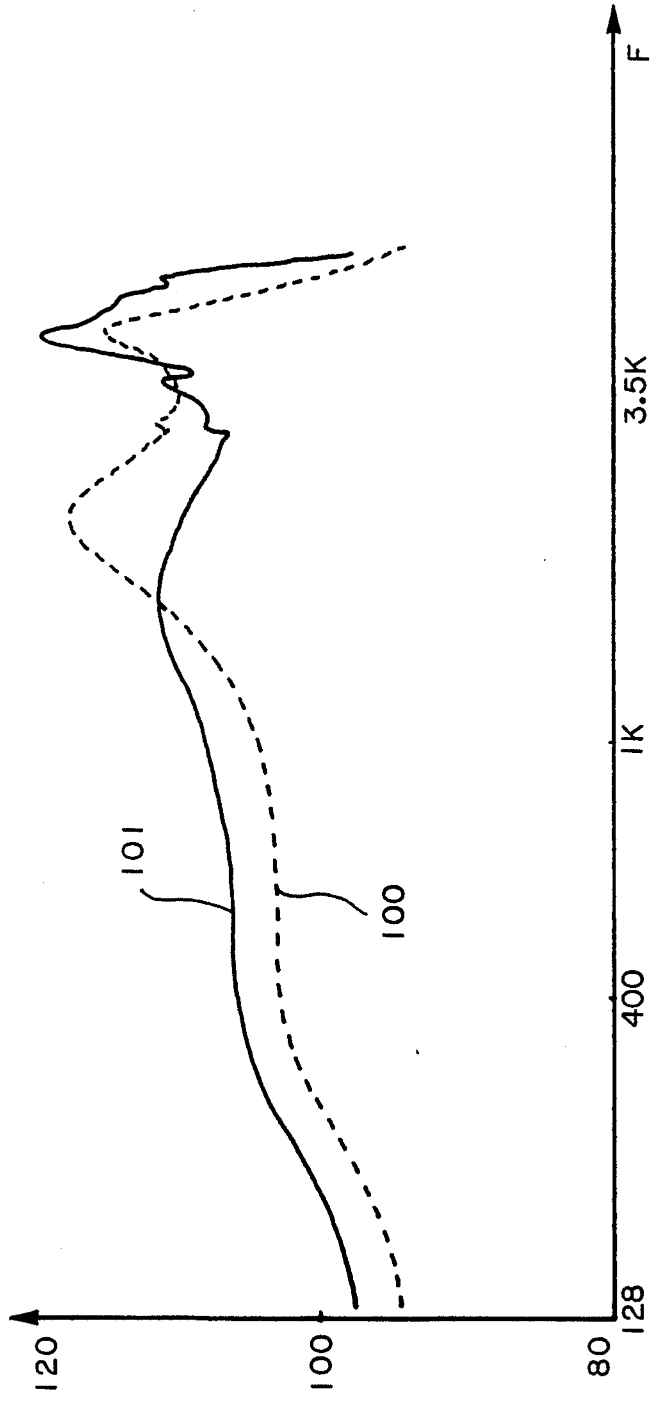
FIG. 6 illustrates the results obtained by a capsule according to the present invention relatively to the frequency response.

This embodiment of the front step 17 with small base 170 and groove 171, associated with holding of the membrane by the resilient holding means 22, improves the frequency response curve of the capsule. Thus, FIG. 6 shows two comparative frequency response curves relative to capsules of identical dimensions, curve 100 corresponding to a capsule in which the disk is held in position by an O-seal on a step of the case, curve 101 corresponding to a capsule according to the invention.

In accordance with the invention, attempts have been made to obtain good sealing between the periphery of membrane 1 and lid 8. Sufficient sealing is obtained by using a very flat disk 2, having in particular on the peripheral portion of its front surface a surface condition and inherent flatness which are sufficient. Simultaneously, the circular supporting surface formed by the small base 170 has a sufficient inherent flatness, so that the two corresponding surfaces formed by the periphery of disk 2 and the small base in the form of a circular ring 170 are applied against each other very intimately and themselves provide sealing, by the action of the resilient holding means holding them applied against each other.

Good results have been obtained by providing an inherent flatness of the small base 170 with a tolerance less than or equal to 0.03 mm.

Simultaneously, it is necessary to provide a compromise between the sealing obtained and the desired freedom in the movements of the peripheral edge of membrane 1. It is apparent that the freedom of movement, allowing membrane 1 to oscillate, requires a relatively small width of small base 170. On the other hand, good sealing is easier to obtain with a relatively wide small base 170. A good compromise is obtained, according to the invention, by providing a sufficient surface condition, as stated above, and a small base 170 width equal to about 0.5 mm.

In the advantageous embodiment shown in the figures, the electric connections between the external electrode 5 and the connection terminal 19 are further simplified by causing the resilient holding means 22 to participate in this connection. For this, the piezoelectric ceramic layer is disposed on the same side as base body 7, as shown in the figures, so that the external electrode 5 faces the base body 7.

The second electric connection terminal 19 is connected electrically by soldering to the second conducting tack 12, itself in contact with a central metal rivet 21. The central metal rivet 21, engaged in a central hole in base body 7, is fast with a resilient electrically conducting means 22 itself in contact with the external electrode 5. Thus, the second electric connection terminal 9 is connected electrically to the external electrode 5 via the conducting track 12, the central rivet 21 and the resilient electrically conducting means 22. Naturally, the conducting tracks 11 and 12 are insulated electrically from each other. Thus, the resilient holding means 22 provide simultaneously the function of electric connection between the external electrode 5 and the corresponding electric connection terminal 19.

In the embodiment shown in the figures, the resilient electrically conducting means 22 are formed by a metal part, made for example from a material sold under the trademark Duriflex, comprising a central portion 23 with a hole for passing the fixing rivet 21 therethrough, and to which are connected three arms 24, 25 and 26. The three arms 24, 25, 26 are each developed substantially in the form of a spiral from the central portion 23. Their respective ends 27, 28 and 29 are equidistant from the center 30 of the central portion 23 or center of the hole through which the fixing rivet 21 passes, and are equidistant from each other, spaced evenly apart at 120° about the center 30. The respective lengths of the three arms are unequal and their widths are also unequal. In the embodiment shown, the first arm 24 is developed at an angle B of about 92° , whereas the second arm 25 is developed at an angle C of about 120° , and the third arm 26 is developed at an angle A of about 86° . The respective widths of the arms are chosen as a function of the respective lengths so that the bearing forces exerted by each of the ends 27, 28 and 29 of the arms against the external electrode 5 are substantially equal. Under these conditions, each of the arms has a natural vibratory characteristic different from that of each of the other two arms.

The distance between center 30 and each of the ends 27, 28 and 29 of the arms is chosen substantially equal to the radius of the nodal circle of membrane 1. By nodal circle is meant the loci of the vibration nodes of the third circular vibration mode of membrane 1. This nodal circle may be defined empirically, by causing a membrane to vibrate in the third vibration mode, and locating the position of the vibration nodes forming the nodal circle. The vibration nodes may be detected by any means known in the technique, for example by observing the movement of a powder sprinkled on the surface of a membrane which is caused to vibrate.

Part 22 may be formed by stamping and shaping a plate of suitable thickness made from a resilient and electrically conducting material.

Alternately, two or three separate parts may be used, one end of which is fixed to the base body 7 and the other end of which bears on an appropriate zone of the external electrode 5.

To reduce the variations in the electroacoustic properties of the capsules, during fitting, a silicon cord may be advantageously disposed between the front step 17 of the case and the peripheral portion of the front membrane surface.

The present invention is not limited to the embodiments which have been explicitly described, but it includes the different variants and generalizations thereof contained within the accompanying claims.

We claim:

1. An electroacoustic capsule with piezoelectric membrane, in which :

the membrane is formed of a thin disk on to which is fixed a piezoelectric ceramic layer, covering the central zone of the disk, both faces of which are metallized and form respectively an internal electrode and an external electrode;

the membrane is housed in a case formed of a base body and a lid fitted together along a closed periphery, the base body comprising a first wall substantially parallel to the disk with which it forms a rear acoustic cavity, the lid comprising a second wall substantially parallel to the disk with which it forms a front acoustic cavity;

case comprises a front peripheral step against which the periphery of the disk is held applied by resilient holding means;

a first and a second electric connection terminals are insulated electrically and mounted on the base body said first electric connection terminal is connected electrically to said internal electrode by first electric connection means;

said second electric connection terminal is connected electrically to said external electrode by second electric connection means;

wherein :

said thin disk comprises a peripheral portion of its front face with a substantially flat shape, forming a zone of contact with the front peripheral step;

said front peripheral step comprises a precise circular supporting surface defining a continuous flat surface for contact with said disk, the inherent flatness being provided with a tolerance less than or equal to 0.03 mm;

the resilient holding means bear on the intermediate zone of the rear face of the membrane; so that the inherent flatness of the contacting surfaces of said front peripheral step and said thin disk urged one against the other provide sealing between the front acoustic cavity and the rear acoustic cavity.

2. The electroacoustic capsule as claimed in claim 1, wherein the circular supporting surface of said front peripheral step is formed by flow-turning.

3. The electroacoustic capsule as claimed in claim 1, wherein, in radial cross section, said front step has a trapezium shaped profile whose small base forms the circular bearing surface for the membrane, said small base being separated from the peripheral wall of the case by a peripheral groove.

4. The electroacoustic capsule as claimed in claim 3, wherein said small base forming a circular supporting surface has a width equal to about 0.5 mm.

5. The electroacoustic capsule as claimed in claim 4, wherein a silicon cord is inserted between said front step of the case and the peripheral portion of the front face of said membrane.

6. The electroacoustic capsule as claimed in claim 1, wherein said resilient holding means bear on the membrane in the vicinity of the nodal circle of said membrane, at at least two contact points distant from each other.

7. The electroacoustic capsule as claimed in claim 6, wherein to each bearing point of said resilient holding means on the membrane there corresponds a resilient connection having different mechanical characteristics, presenting different natural vibratory modes.

8. The electroacoustic capsule as claimed in claim 6, wherein said resilient holding means comprise several separate resilient elements, each of said elements being fixed to the base body and bearing on the membrane.

9. The electroacoustic capsule as claimed in claim 6, wherein said resilient holding means comprise a single element with several arms, a central portion of said single element being fixed to said base body, the ends of the arms bearing on said membrane.

10. The electroacoustic capsule as claimed in claim 9, wherein said arms have widths and lengths which are different with respect to each other, while producing substantially equal bearing forces on the membrane.

11. The electroacoustic capsule as claimed in claim 9, wherein said single element forming a resilient holding means comprises three arms whose bearing points on the external electrode are spaced apart at 120° about the center of said electrode, the bearing forces being equal.

12. The electroacoustic capsule as claimed in claim 9, wherein the arms of said single element forming a resilient holding means each have a spiral shape.

13. The electroacoustic capsule as claimed in claim 1, wherein the bearing force exerted by said resilient holding means on the membrane is between 0.3 Newton and 0.5 Newton.

14. The electroacoustic capsule as claimed in claim 1, wherein: said piezoelectric ceramic layer forms the rear face of the disk, facing the base body so that the external electrode faces said base body the front face of the periphery of said disk faces said case step itself formed in the lid, said resilient holding means are made from an electrically conducting material and they are inserted between said external electrode and the internal face of said base body bearing both on the external electrode and on a portion of said base body connected electrically to the second electric connection terminal for providing the electric connection between the second electric connection terminal and said external electrode.

15. The electroacoustic capsule as claimed in claim 1, wherein the respective heights (H1, H2) of said front acoustic cavity and said rear acoustic cavity of the capsule are equal to about 1 mm.

* * * * *